United States Patent
Furukawa et al.

(10) Patent No.: US 6,793,843 B2
(45) Date of Patent: Sep. 21, 2004

(54) PIEZOELECTRIC CERAMIC

(75) Inventors: Masahito Furukawa, Narita (JP); Kenji Horino, Narita (JP); Shogo Murosawa, Katori (JP); Yoshiko Gokita, Katori (JP)

(73) Assignee: TDK Corporation, Tokyo (JP)

( * ) Notice: Subject to any disclaimer, the term of this patent is extended or adjusted under 35 U.S.C. 154(b) by 58 days.

(21) Appl. No.: 10/181,250

(22) PCT Filed: Oct. 17, 2001

(86) PCT No.: PCT/JP01/09104

§ 371 (c)(1),
(2), (4) Date: Jul. 16, 2002

(87) PCT Pub. No.: WO02/42239

PCT Pub. Date: May 30, 2002

(65) Prior Publication Data

US 2003/0134738 A1 Jul. 17, 2003

(30) Foreign Application Priority Data

Nov. 21, 2000 (JP) .................................... 2000-353891
Feb. 28, 2001 (JP) .................................... 2001-055777
Mar. 1, 2001 (JP) .................................... 2001-057228
Aug. 9, 2001 (JP) .................................... 2001-242181

(51) Int. Cl.$^7$ .......................... C04B 35/46; H01L 41/18
(52) U.S. Cl. ........................ 252/62.9 R; 252/62.9 PZ; 501/134; 501/135; 501/136; 501/138; 501/139
(58) Field of Search ................. 252/62.9 PZ, 62.9 R; 501/134, 135, 136, 138, 139

(56) References Cited

U.S. PATENT DOCUMENTS 6,426,018 B1 * 7/2002 Takahashi et al. ..... 252/62.9 R

FOREIGN PATENT DOCUMENTS

| DE | 19530592 | * | 8/1996 |
|----|----------|---|--------|
| JP | A 11-60333 | | 3/1999 |
| JP | A 11-171643 | | 6/1999 |
| JP | A 11-180769 | | 7/1999 |
| JP | A 11-228226 | | 8/1999 |
| JP | A 2001-80995 | | 3/2001 |
| JP | A 2001-261435 | | 9/2001 |

* cited by examiner

*Primary Examiner*—C. Melissa Koslow
(74) *Attorney, Agent, or Firm*—Oliff & Berridge, PLC

(57) ABSTRACT

Provided is a piezoelectric ceramic capable of improving its piezoelectric properties. The piezoelectric ceramic comprises a rhombohedral perovskite structure compound such as $(Na_{0.5}Bi_{0.5})TiO_3$, a tetragonal perovskite structure compound such as $BaTiO_3$ and $(K_{0.5}Bi_{0.5})TiO_3$ and an orthorhombic perovskite structure compound such as $NaNbO_3$, $KNbO_3$ and $CaTiO_3$, or the rhombohedral perovskite structure compound, the tetragonal perovskite structure compound and a cubic perovskite structure compound such as SrTiO3. Three kinds of perovskite structure compounds having different crystal structures are comprised, so that the piezoelectric properties can be improved. The three kinds of compounds may perfectly form a solid solution or not.

32 Claims, No Drawings

PIEZOELECTRIC CERAMIC

TECHNICAL FIELD

The present invention relates to a piezoelectric ceramic widely used in the field of actuators, sensors, resonators or the like.

BACKGROUND ART

Piezoelectric materials have an effect of creating a distortion by externally applying an electric field (conversion from an electrical energy into a mechanical energy) and an effect of generating an electric charge on a surface thereof by externally imposing a stress (conversion from a mechanical energy into an electrical energy), and in recent years, the piezoelectric materials have been widely used in various fields. For example, as piezoelectric materials such as lead zirconate titanate (Pb(Zr,Ti)O$_3$; PZT) create a distortion substantially proportional to an applied voltage on the order of $1 \times 10^{-10}$ m/V, the piezoelectric materials are superior in fine positioning, etc., therefore, the piezoelectric materials are used for fine adjustments, etc. in optical systems. On the other hand, as the piezoelectric materials generate an electric charge proportional to an imposed stress or the amount of strain in the piezoelectric materials by the imposed stress, the piezoelectric materials are used as sensors for detecting a minute force, deformation or the like. Further, the piezoelectric materials have an excellent response, so that by applying an AC electric field, the piezoelectric materials can excite themselves or an elastic body connected thereto to produce resonance. Therefore, the piezoelectric materials are used as piezoelectric transformers, ultrasonic motors or the like.

Most of piezoelectric materials practically used at present are solid solutions (PZT-based) including PbZrO$_3$(PZ)-PbTiO$_3$(PT), because superior piezoelectric properties can be obtained by the use of a composition of rhombohedral PZ and tetragonal PT near a crystallographic morphotropic phase boundary (M.P.B.). The PZT-based piezoelectric materials have been widely developed in response to various needs through adding various auxiliary components or additives. There are various PZT-based piezoelectric materials ranging, for example, from those with a small mechanical quality factor (Qm) and a large piezoelectric constant (d$_{33}$) used for DC devices such as actuators, etc. for positioning which can obtain a large amount of displacement to those with a small piezoelectric constant (d$_{33}$) and a large mechanical quality factor (Qm) suitable for AC devices such as ultrasonic generating devices, for example, ultrasonic motors.

Moreover, except for the PZT-based piezoelectric materials, there are other practically used piezoelectric materials, most of which are solid solutions including a lead-based perovskite composition such as lead magnesium niobate (Pb(Mg,Nb)O$_3$; PMN) or the like as a main component.

However, these lead-based piezoelectric materials include lead oxide (PbO) with extremely high volatility even at a low temperature as much as the order of 60 to 70% by mass as a main component. For example, approximately 2/3 of PZT or PMN contains lead oxide in mass ratio. Therefore, when manufacturing these piezoelectric materials, in heat treatment such as a firing step for ceramics and a melting step for single crystal products, a very large amount of lead oxide volatilizes and diffuses at an industrial level. Further, although lead oxide released in a manufacturing step can be recovered, it is difficult to recover lead oxide included in piezoelectric products placed on the market as industrial products under the status quo, so if lead oxide is widely released into the environment, there are worries that lead may be leached due to acid rain. Therefore, when the piezoelectric ceramics and single crystals have a wider area of application, and the amount of use thereof increases in future, a very important challenge is to develop lead-free piezoelectric materials.

As piezoelectric materials including no lead, for example, barium titanate (BaTiO$_3$) or bismuth layer ferroelectric is known. However, barium titanate has a low Curie point of 120° C., so that a temperature higher than 120° C. destroys the piezoelectric properties thereof. Therefore, for soldering and application for vehicles, barium titanate is not practical. On the other hand, bismuth layer ferroelectric typically has a Curie point of 400° C. or over, so the thermal stability thereof is superior, but the crystal anisotropy thereof is large. Therefore, it is required to orient a spontaneous polarization through hot-forging or the like, so there is a problem in productivity. Further, when lead is not included at all, it is difficult to obtain large piezoelectric properties.

Moreover, the development of bismuth sodium titanate-based materials as novel materials has been proceeding recently. For example, in Japanese Examined Patent Publication No. Hei 4-60073 and Japanese Unexamined Patent Publication No. Hei 11-180769, materials including bismuth sodium titanate and barium titanate are disclosed, and in Japanese Unexamined Patent Publication No. Hei 11-171643, materials including bismuth sodium titanate and bismuth potassium titanate are disclosed. However, the bismuth sodium titanate-based materials have not yet obtained sufficient piezoelectric properties, compared with lead-based piezoelectric materials, so the improvement in piezoelectric properties has been in demand.

In view of foregoing, it is an object of the present invention to provide a piezoelectric ceramic having superior piezoelectric properties and being superior in the point of ultra-low emission, environmental friendliness and ecology.

DISCLOSURE OF THE INVENTION

A first piezoelectric ceramic according to the invention comprises three kinds or more of perovskite structure compounds having different crystal structures.

A second piezoelectric ceramic according to the invention comprises a solid solution including three kinds or more of perovskite structure compounds having different crystal structures.

In the first and the second piezoelectric ceramics according to the invention, by the use of three kinds of compounds having different crystal structures, the piezoelectric properties can be improved. Moreover, it is preferable in the point of ultra-low emission, environmental friendliness and ecology that the content of lead (Pb) is 1% by mass or less.

As the three kinds or more of perovskite structure compounds having different crystal structures, a rhombohedral perovskite structure compound, a tetragonal perovskite structure compound and an orthorhombic perovskite structure compound are preferably comprised.

The composition ratio of these compounds is preferably within a range shown in Chemical Formula 1 in molar ratio. That is, the composition ratios of the rhombohedral perovskite structure compound, the tetragonal perovskite structure compound and the orthorhombic perovskite structure compound represent a, b and c, respectively, and the values of a, b and c are preferably within a range satisfying a+b+c=1, 0.40<a≦0.99, 0<b≦0.40, 0<c<0.20, respectively, and more preferably within a range satisfying a+b+c=1, 0.50<a≦0.99, 0<b≦0.30, 0<c<0.20, respectively.

The composition ratio of these compounds and the composition ratio of an element at the A-site to an element at the B-site in each of these compounds preferably have a relation shown in Mathematical Formula 1. That is, the sum of the products of the composition ratio of each of three kinds of compounds and the composition ratio of an element at the A-site to an element at the B-site in the each of three kinds of compounds is preferably within a range from 0.9 to 1.0 inclusive.

Moreover, as another three kinds or more of perovskite structure compounds having different crystal structures, a rhombohedral perovskite structure compound, a tetragonal perovskite structure compound and a cubic perovskite structure compound are preferably comprised.

The composition ratio of these compounds is preferably within a range shown in Chemical Formula 2 in molar ratio. That is, the composition ratios of the rhombohedral perovskite structure compound, the tetragonal perovskite structure compound and the cubic perovskite structure compound represent a, b and d, respectively, and the values of a, b and d are preferably within a range satisfying a+b+d=1, 0.60≦a≦0.99, 0<b≦0.20, 0<d≦0.20, respectively.

The composition ratio of these compounds and the composition ratio of an element at the A-site to an element at the B-site in each of these compounds preferably have a relation shown in Mathematical Formula 2. That is, the sum of the products of the composition ratio of each of three kinds of compounds and the composition ratio of an element at the A-site to an element at the B-site in the each of three kinds of compounds is preferably within a range from 0.9 to 1.0 inclusive.

A third piezoelectric ceramic according to the invention comprises a first oxide including sodium bismuth titanate, at least one kind of second oxide selected from the group consisting of potassium bismuth titanate and barium titanate, and at least one kind of third oxide selected from the group consisting of sodium niobate, potassium niobate and calsium titanate.

A fourth piezoelectric ceramic according to the invention comprises a solid solution including a first oxide including sodium bismuth titanate, at least one kind of second oxide selected from the group consisting of potassium bismuth titanate and barium titanate, and at least one kind of third oxide selected from the group consisting of sodium niobate, potassium niobate and calcium titanate.

In the third and fourth piezoelectric ceramics according to the invention, by the use of the first oxide, the second oxide and the third oxide, the piezoelectric properties can be improved.

Further, as the second oxide, potassium bismuth titanate or barium titanate is preferably included. The composition ratio of these oxides is preferably within a range shown in Chemical Formula 3 in molar ratio. That is, the composition ratios of the first oxide, the second oxide and the third oxide represent a, b and c, respectively, and the values of a, b and c are preferably within a range satisfying a+b+c=1, 0.40<a≦0.99, 0<b≦0.40, 0<c<0.20, respectively, and more preferably within a range satisfying a+b+c=1, 0.50<a≦0.99, 0<b≦0.30, 0<c<0.20, respectively.

The composition ratio of the first oxide, the second oxide and the third oxide and the composition ratio of a first element of the first oxide to a second element of the first oxide, the composition ratio of a first element of the second oxide to a second element of the second oxide, and the composition ratio of a first element of the third oxide to a second element of the third oxide preferably have a relation shown in Mathematical Formula 3. That is, the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide, and the product of the composition ratio c of the third oxide and the composition ratio z of the first element of the third oxide to the second element of the third oxide is preferably within a range from 0.9 to 1.0 inclusive.

A fifth piezoelectric ceramic according to the invention comprises a first oxide including sodium bismuth titanate, at least one kind of second oxide selected from the group consisting of potassium bismuth titanate and barium titanate and a fourth oxide including strontium titanate.

A sixth piezoelectric ceramic according to the invention comprises a solid solution including a first oxide including sodium bismuth titanate, at least one kind of second oxide selected from the group consisting of potassium bismuth titanate and barium titanate and a fourth oxide including strontium titanate.

In the fifth and sixth piezoelectric ceramics according to the invention, by the use of the first oxide, the second oxide and the fourth oxide, the piezoelectric properties can be improved.

Further, the composition ratio of these oxides is preferably within a range shown in Chemical Formula 4 in molar ratio. That is, the composition ratios of the first oxide, the second oxide and the fourth oxide represent a, b and d, respectively, and the values of a, b and d are preferably within a range satisfying a+b+d=1, 0.60≦a≦0.99, 0<b≦0.20, 0<d≦0.20, respectively.

The composition ratio of the first oxide, the second oxide and the fourth oxide and the composition ratio of a first element of the first oxide to a second element of the first oxide, the composition ratio of a first element of the second oxide to a second element of the second oxide, and the composition ratio of a first element of the fourth oxide to a second element of the fourth oxide preferably have a relation shown in Mathematical Formula 4. That is, the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide, and the product of the composition ratio d of the fourth oxide and the composition ratio w of the first element of the fourth oxide to the second element of the fourth oxide is preferably within a range from 0.9 to 1.0 inclusive.

Other and further objects, features and advantages of the invention will appear more fully from the following description.

BEST MODE FOR CARRYING OUT THE INVENTION

Preferred embodiments are described in detail below.

[First Embodiment]

A piezoelectric ceramic according to a first embodiment of the invention comprises a rhombohedral perovskite structure compound, a tetragonal perovskite structure compound and an orthorhombic perovskite structure compound, or comprises a solid solution including a rhombohedral perovskite structure compound, a tetragonal perovskite structure compound and an orthorhombic perovskite structure compound. That is, the piezoelectric ceramic comprises three kinds of perovskite structure compounds having different crystal structures, which may form a solid solution or may not perfectly form a solid solution.

Thereby, in at least a part of the piezoelectric ceramic, a crystallographic morphotropic phase boundary (M.P.B.) is formed so as to improve the piezoelectric properties. More specifically, compared with a one- or two-component based piezoelectric ceramic, in the piezoelectric ceramic, the electromechanical coupling factor and the relative dielectric constant are improved, and accordingly the amount of displacement is improved.

As the rhombohedral perovskite structure compound, for example, there is a first oxide including sodium bismuth titanate. The first oxide includes a first element of the first oxide at the A-site of the perovskite structure, a second element of the first oxide at the B-site of the perovskite structure and oxygen, and the composition thereof is expressed by, for example, Chemical Formula 5.

In Chemical Formula 5, A1 represents the first element of the first oxide, and A2 represents the second element of the first oxide. In the case where the first oxide has a stoichiometric composition, x is 1, but the first oxide may deviate from the stoichiometric composition. It is preferable that x is 1 or less because the sinterability can be improved, and higher piezoelectric properties can be obtained. The composition of oxygen is determined from the stoichiometric composition, and may deviate from the stoichiometric composition.

In the case of sodium bismuth titanate, sodium (Na) and bismuth (Bi) correspond to the first element of the first oxide. The composition ratio of sodium to bismuth in sodium bismuth titanate is 1:1 in molar ratio in the case of the stoichiometric composition, but it may deviate from the stoichiometric composition. In the case of sodium bismuth titanate, titanium (Ti) corresponds to the second element of the first oxide.

The rhombohedral perovskite structure compound may include one kind of compound or a plurality of kinds of compounds. In the case where it includes a plurality of kinds of compounds, the compounds may form a solid solution or not.

As the tetragonal perovskite structure compound, for example, there is at least one kind of second oxide selected from the group consisting of potassium bismuth titanate and barium titanate. The second oxide includes a first element of the second oxide at the A-site of the perovskite structure, a second element of the second oxide at the B-site of the perovskite structure and oxygen, and the composition thereof is expressed by, for example, Chemical Formula 6.

In Chemical Formula 6, B1 represents the first element of the second oxide, and B2 represents the second element of the second oxide. In the case where the second oxide has a stoichiometric composition, y is 1, but the second oxide may deviate from the stoichiometric composition. The composition of oxygen is determined from the stoichiometric composition, and it may deviate from the stoichiometric composition.

In the case of potassium bismuth titanate, potassium (K) and bismuth correspond to the first element of the second oxide, and in the case of barium titanate, barium (Ba) corresponds to the first element of the second oxide. The composition ratio of potassium to bismuth in potassium bismuth titanate is 1:1 in molar ratio in the case of the stoichiometric composition, but it may deviate from the stoichiometric composition. In both case of potassium bismuth titanate and barium titanate, titanium corresponds to the second element of the second oxide.

Like the rhombohedral perovskite structure compound, the tetragonal perovskite structure compound may include one kind of compound or a plurality of kinds of compounds. In the case where it includes a plurality of kinds of compounds, they may form a solid solution or not. Further, it is preferable that the tetragonal perovskite structure compound includes potassium bismuth titanate, so that a larger amount of displacement can be obtained and the tetragonal perovskite structure compound includes potassium bismuth titanate and barium titanate, so that a larger amount of displacement can be obtained.

As the orthorhombic perovskite structure compound, for example, there is at least one kind of third oxide selected from the group consisting of sodium niobate, potassium niobate and calcium titanate. The third oxide includes a first element of the third oxide at the A-site of the provskite structure, a second element of the third oxide at the B-site of the perovskite structure and oxygen, and the composition thereof is expressed by, for example, Chemical Formula 7.

In Chemical Formula 7, C1 represents the first element of the third oxide, and C2 represents the second element of the third oxide. In the case where the third oxide has a stoichiometric composition, z is 1, but it may deviate from the stoichiometric composition. The composition of oxygen is determined from the stoichiometric composition, and it may deviate from the stoichiometric composition.

In the case of sodium niobate, sodium corresponds to the first element of the third oxide, in the case of potassium niobate, potassium corresponds to the first element of the third oxide, and in the case of calcium titanate, calcium (Ca) corresponds to the first element to the third oxide. In the case of sodium niobate and potassium niobate, niobium corresponds to the second element of the third oxide, in the case of calcium titanate, titani corresponds to the second element of the third oxide.

Like the rhombohedral perovskite structure compound, the orthorhombic perovskite structure compound may include one kind of compound or a plurality of kinds of compounds. In the case where the ortherhombic perovsikite structure compound includes a plurality of kinds of compounds, they may form a solid solution or not.

The composition ratio of the rhombohedral perovskite structure compound, the tetragonal perovskite structure compound and the orthorhombic perovskite structure compound, for example, the composition ratio of the first oxide, the second oxide and the third oxide is preferably within a range shown in Chemical Formula 8 in molar ratio. When the contents of the tetragonal perovskite structure compound and the orthorhombic perovskite structure compound are too high, the piezoelectric properties decline, and when the contents thereof are too low, effects achieved through comprising three kinds of perovskite structure compounds having different crystal structures cannot be sufficiently obtained.

In Chemical Formula 8, A represents the rhombohedral perovskite structure compound (for example, the first oxide), B represents the tetragonal perovskite structure compound (for example, the second oxide) and C represents the orthorhombic perovskite structure compound (for example, the third oxide). The values of a, b and c are within a range satisfying $a+b+c=1$, $0.40 < a \leq 0.99$, $0 < b \leq 0.40$, $0 < c < 0.20$, respectively.

In this case, the composition ratio is a value in the piezoelectric ceramic including a compound forming a solid solution and a compound not forming a solid solution. Further, in Chemical Formula 8, the value of b is preferably within a range less than 0.40, more preferably within a range of 0.35 or less, and most preferably within a range of 0.30 or less. Moreover, the value of c is more preferably within a range of 0.15 or less. Thus, a larger amount of displacement can be obtained within the above ranges.

Moreover, depending upon kinds of the rhombohedral perovskite structure compound, the tetragonal perovskite structure compound and the orthorhombic perovskite structure compound, the optimum range of the composition ratio thereof may vary. For example, in the case where the tetragonal perovskite structure compound includes barium titanate, the smaller the values of b and c in Chemical Formula 8 are, the better amount of displacement can be obtained compared with the case where the compound includes potassium bismuth titanate. In this case, in Chemical Formula 8, the values of a, b and c are preferably within a range satisfying $a+b+c=1$, $0.7<a\leqq0.99$, $0<b\leqq0.15$, $0<c<0.15$, respectively, or within a range satisfying $a+b+c=1$, $0<b$, $0<c$, $0<b+c<0.2$.

It is preferable that the composition ratio of the rhombohedral perovskite structure compound, the tetragonal perovskite structure compound and the orthorhombic perovskite structure compound and the composition ratio of an element at the A-site to an element at the B-site in each of these compounds (the element at the A-site/the element at the B-site) have a relation shown in Mathematical Formula 5.

In Mathematical Formula 5, as shown in Chemical Formula 8, a, b and c represent the composition ratio of the rhombohedral perovskite structure compound, the tetragonal perovskite structure compound and the orthorhombic perovskite structure compound in molar ratio, respectively. For example, as shown in Chemical Formulas 5, 6 and 7, x, y and z represent the composition ratio of an element at the A-site in molar ratio in the case where an element at the B-site is 1 in each of the rhombohedral perovskite structure compound, the tetragonal perovskite structure compound and the orthorhombic perovskite structure compound, that is, the composition ratio of an element at the A-site to an element at the B-site in molar ratio.

In other words, for example, when the first oxide, the second oxide and the third oxide are comprised, the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide, and the product of the composition ratio c of the third oxide and the composition ratio z of the first element of the third oxide to the second element of the third oxide is preferably within a range from 0.9 to 1.0 inclusive. It is because, as described in Chemical Formula 5, in the case where the sum is 1.0 or less, higher sinterability and superior piezoelectric properties can be obtained, and on the other hand, when the sum is less than 0.9, the piezoelectric properties will decline.

Further, the piezoelectric ceramic may include lead, although the content of lead is preferably 1% by mass or less, and more preferably the piezoelectric ceramic does not include lead at all. Thereby, the volatilization of lead during firing and the release of lead into the environment after the piezoelectric ceramic as a piezoelectric ceramic product is distributed into the market and then discarded can be minimized, so it is preferable in the point of ultra-low emission, environmental friendliness and ecology. In addition, the average particle diameter of the crystal particle of the piezoelectric ceramic is, for example, within a range from 0.5 $\mu$m to 20 $\mu$m.

The piezoelectric ceramic having such a structure can be manufactured, for example, through the following method.

Firstly, as starting materials, bismuth oxide ($Bi_2O_3$) powders, sodium carbonate ($Na_2CO_3$) powders, potassium carbonate ($K_2CO_3$) powders, barium carbonate ($BaCO_3$) powders, calcium carbonate ($CaCO_3$) powders, titanium oxide ($TiO_2$) powders, niobium oxide ($Nb_2O_5$) powders and so on are prepared as required, and after the powders are sufficiently dried at 100° C. or over, the powders are weighed according to a target composition. In addition, as the starting materials, instead of oxides, materials such as carbonates or oxalates which become oxides through firing may be used, and instead of carbonates, oxides or any other materials which become oxides through firing may be used.

Next, for example, the weighed starting materials are sufficiently mixed in an organic solvent or water by the use of a ball mill or the like for 5 to 20 hours, and then the mixture is sufficiently dried, press-molded and pre-calcined for about 1 to 3 hours at 750° C. to 900° C. Then, after the pre-calcined body is pulverized by the ball mill or the like in the organic solvent or water for 10 to 30 hours, the pulverized body is dried again, and a binder is added to granulate the body. After granulating, for example, the granulated body is press-molded through pressing with a load of 100 MPa to 400 MPa by the use of a uniaxial press molding apparatus or a cold isostatic pressing (CIP) apparatus to be pelletized.

After pelletized, for example, the pelletized body is heated for the order of 2 hours to 4 hours at 400° C. to 800° C. to volatilize the binder, and then are fired for the order of 2 hours to 4 hours at 950° C. to 1300° C. The heating rate and the cooling rate during firing are, for example, within a range from 50° C./hour to 300° C./hour. After firing, the sintered body obtained is polished as required, and then an electrode is disposed thereon. After that, in silicon oil at 25° C. to 100° C., an electric field of 5 MV/m to 10 MV/m is applied to the sintered body for 5 minutes to 1 hour to carry out a polarization treatment. Thereby, the above-described piezoelectric ceramic can be obtained.

Thus, according to the embodiment, as the piezoelectric ceramic comprises the rhombohedral perovskite structure compound such as the first oxide, the tetragonal perovskite structure compound such as the second oxide and the orthorhombic perovskite structure compound such as the third oxide, or a solid solution including them, compared with a one- or two-component based piezoelectric ceramic, the electromechanical coupling factor and the relative dielectric constant can be improved, and accordingly the amount of displacement can be improved.

Therefore, the piezoelectric ceramic including no lead or a small amount of lead can have higher applicability. That is, the piezoelectric ceramic superior in the point of ultra-low emission, environmental friendliness and ecology, which can minimize the volatilization of lead during firing and the release of lead into the environment after the piezoelectric ceramic as a piezoelectric ceramic product is distributed into the market and then discarded, can be used.

Specifically, as shown in Chemical Formula 8, when the composition ratios a, b and c of the rhombohedral perovskite structure compound, the tetragonal perovskite structure compound and the orthorhombic perovskite structure compound are within a range satisfying $a+b+c=1$, $0.40<a\leqq0.99$, $0<b\leqq0.40$, $0<c<0.20$ in molar ratio, respectively, the piezoelectric properties can be further improved.

Moreover, when the value of b in Chemical Formula 8 is within a range less than 0.40, more preferably within a range of 0.35 or less, the most preferably within a range of 0.30 or less, or the value of c is within a range of 0.15 or less, a larger amount of displacement can be obtained.

Moreover, as shown in Mathematical Formula 5, when the sum of the products of the composition ratio of each of three kinds of compounds and the composition ratio of an element at the A-site to an element at the B-site in the each of three kinds of compounds is within a range from 0.9 to 1.0 inclusive, or when the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide and the product of the composition ratio c of the third oxide and the composition ratio z of the first element of the third oxide to the second element of the third oxide is within a range from 0.9 to 1.0 inclusive, higher sinterability can be obtained and the piezoelectric properties can be further improved.

In addition, when potassium bismuth titanate is included as the tetragonal perovskite structure compound, and more specifically when potassium bismuth titanate and barium titanate are included, a larger amount of displacement can be obtained.

[Second Embodiment]

A piezoelectric ceramic according to a second embodiment of the invention comprises a rhombohedral perovskite structure compound, a tetragonal perovskite structure compound and a cubic perovskite structure compound, or comprises a solid solution including the rhombohedral perovskite structure compound, the tetragonal perovskite structure compound and the cubic perovskite structure compound. That is, as in the case of the piezoelectric ceramic according to the first embodiment, the piezoelectric ceramic comprises three kinds of perovskite structure compounds having different crystal structures, except that the cubic perovskite structure compound is comprised instead of the orthorhombic perovskite structure compound. They may form a solid solution or may not perfectly form a solid solution.

Thereby, in at least a part of the piezoelectric ceramic, a crystallographic morphotropic phase boundary (M.P.B.) is formed so as to improve the piezoelectric properties. More specifically, compared with a one- or two-component based piezoelectric ceramic, in the piezoelectric ceramic, the electromechanical coupling factor and the relative dielectric constant are improved, and accordingly the amount of displacement is improved.

The rhombohedral perovskite structure compound and the tetragonal perovskite structure compound are the same as those of the first embodiment. In addition, the tetragonal perovskite structure compound may include potassium bismuth titanate, barium titanate, or both.

As the cubic perovskite structure compound, there is a froth oxide including strontium titanate, for example. The fourth oxide includes a first element of the fourth oxide at the A-site of the perovskite structure, a second element of the fourth oxide at the B-site of the perovskite structure and oxygen, and the composition thereof is expressed by, for example, Chemical Formula 9.

In Chemical Formula 9, D1 represents the first element of the fourth oxide, and D2 represents the second element of the fourth oxide. In the case where the fourth oxide has a stoichiometric composition, w is 1, but it may deviate from the stoichiometric composition. The composition of oxygen is determined from the stoichiometric composition, and it may deviate from the stoichiometric composition.

In the case of strontium titanate, strontium (Sr) corresponds to the first element of the fourth oxide, and titanium corresponds to the second element of the fourth oxide. Like the rhombohedral perovskite structure compound, the cubic perovskite structure compound may include one kind of compound or a plurality of kinds of compounds. In the case where it includes a plurality of kinds of compounds, the compounds may form a solid solution or not.

The composition ratio of the rhombohedral perovskite structure compound, the tetragonal perovskite structure compound and the cubic perovskite structure compound, for example, the composition ratio of the first oxide, the second oxide and the fourth oxide is preferably within a range shown in Chemical Formula 10 in molar ratio. When the contents of the tetragonal perovskite structure compound and the cubic perovskite structure compound are too high, the piezoelectric properties decline, and when the contents thereof are too low, effects achieved through comprising three kinds of perovskite structure compounds having different crystal structures cannot be sufficiently obtained.

Moreover, in Chemical Formula 10, A represents the rhombohedral perovskite structure compound (for example, the first oxide), B represents the tetragonal perovskite structure compound (for example, the second oxide) and D represents the cubic perovskite structure compound (for example, the fourth oxide). The values of a, b and d are within a range satisfying $a+b+d=1$, $0.60 \leq a \leq 0.99$, $0 < b \leq 0.20$ and $0 < d \leq 0.20$, respectively.

In this case, the composition ratio is a value in the piezoelectric ceramic including a compound forming a solid solution and a compound not forming a solid solution. Further, in Chemical Formula 10, in the case where the tetragonal perovskite structure compound is barium titanate, the value of b is more preferably within a range of $0 < b \leq 0.15$, and most preferably within a range of $0 < b \leq 0.1$. In the case where the tetragonal perovskite structure compound is potassium bismuth titanate, the value of b is more preferably within a range of $0.10 \leq b \leq 0.20$. Moreover, in Chemical Formula 10, the value of d is more preferably within a range of $0 < d \leq 0.15$. Thus, a larger amount of displacement can be obtained within the above ranges.

It is preferable that the composition ratio of the rhombohedral perovskite structure compound, the tetragonal perovskite structure compound and the cubic perovskite structure compound and the composition ratio of an element at the A-site to an element at the B-site in each of these compounds (the element at the A-site/the element at the B-site) have a relation shown in Mathematical Formula 6.

In Mathematical Formula 6, as shown in Chemical Formula 10, a, b and d represent the composition ratio of the rhombohedral perovskite structure compound, the tetragonal perovskite structure compound and the cubic perovskite structure compound in molar ratio, respectively. For example, as shown in Chemical Formulas 5, 6 and 9, x, y and w represent the composition ratio of an element at the A-site in molar ratio in the case where an element at the B-site is 1 in each of the rhombohedral perovskite structure compound, the tetragonal perovskite structure compound and the cubic perovskite structure compound, that is, the composition ratio of an element at the A-site to an element at the B-site in molar ratio.

In other words, for example, when the first oxide, the second oxide and the fourth oxide are comprised, the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide, and the product of the composition ratio d of the fourth oxide and the composition ratio w of the first element of the fourth oxide to the second element of the fourth oxide is preferably within a range from 0.9 to 1.0 inclusive. As described in the first embodiment, in the case where the sum is 1.0 or less, higher sinterability and superior piezoelectric properties can be obtained, and on the other hand, when the sum is less than 0.9, the piezoelectric properties will decline.

Further, the piezoelectric ceramic may include lead, although, as described in the first embodiment, the content of lead is preferably 1% by mass or less, and more preferably, the piezoelectric ceramic does not include lead at all. In addition, the average particle diameter of the crystal particle of the piezoelectric ceramic is, for example, within a range from 0.5 $\mu$m to 20 $\mu$m, which is the same as that in the first embodiment.

The piezoelectric ceramic having such a structure can be manufactured, for example, as in the same manner as the first embodiment. As starting materials, powders of bismuth oxide, sodium carbonate, potassium carbonate, barium carbonate, strontium carbonate ($SrCO_3$), titanium oxide ($TiO_2$) and so on are prepared as required. In addition, as the starting materials, instead of oxides, materials such as carbonates or oxalates which become oxides through firing may be used, and instead of carbonates, oxides or any other materials which become oxides through firing may be used.

Thus, according to the embodiment, as the piezoelectric ceramic comprises the rhombohedral perovskite structure compound such as the first oxide, the tetragonal perovskite structure compound such as the second oxide and the cubic perovskite structure compound such as the fourth oxide, or a solid solution including them, like the first embodiment, compared with a one- or two-component based piezoelectric ceramic, the electromechanical coupling factor and the relative dielectric constant can be improved, and accordingly, the amount of displacement can be improved. Therefore, the piezoelectric ceramic including no lead or a small amount of lead can have higher applicability.

Specifically, as shown in Chemical Formula 10, when the composition ratios a, b and d of the rhombohedral perovskite structure compound, the tetragonal perovskite structure compound and the cubic perovskite structure compound are within a range satisfying a+b+d=1, $0.60 \leq a \leq 0.99$, $0 < b \leq 0.20$, $0 < d \leq 0.20$ in molar ratio, respectively, the piezoelectric properties can be further improved.

Moreover, as shown in Mathematical Formula 6, when the sum of the products of the composition ratio of each of three kinds of compounds and the composition ratio of an element at the A-site to an element at the B-site in the each of three kinds of compounds is within a range from 0.9 to 1.0 inclusive, or when the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide and the product of the composition ratio d of the fourth oxide and the composition ratio w of the first element of the fourth oxide to the second element of the fourth oxide is within a range from 0.9 to 1.0 inclusive, higher sinterability can be obtained and the piezoelectric properties can be further improved.

Moreover, specific examples of the invention are described below.

EXAMPLES 1-1 to 1-16

Piezoelectric ceramic comprising the first oxide $(Na_{0.5}Bi_{0.5})TiO_3$ as the rhombohedral perovskite structure compound, the second oxide $BaTiO_3$ as the tetragonal perovskite structure compound and the third oxide $NaNbO_3$ as the orthorhombic perovskite structure compound were produced. Firstly, as starting materials, bismuth oxide powders, sodium carbonate powders, barium carbonate powders, titanium oxide powders and niobium oxide powders were prepared, and after sufficiently dried at 100° C. or over, they were weighed. The composition ratios of the starting materials in Examples 1-1 to 1-16 varied so that the composition ratios a, b and c shown in Chemical Formula 11 in molar ratio after firing had the values shown in Table 1.

Next, after the weighed starting materials were mixed in acetone by the use of zirconia balls by a ball mill for approximately 15 hours, the mixture was sufficiently dried, press-molded and pre-calcined at 900° C. for approximately 2 hours. Then, after the pre-calcined body was pulverized in acetone by the ball mill for approximately 15 hours, the pulverized body was dried again, and a polyvinyl alcohol (PVA) solution as a binder was added to granulate the body. After that, the granulated body was pre-molded through pressing with a load of 100 MPa by the use of a uniaxial press molding apparatus, then the pre-molded body was molded into the form of a disk-shaped pellet having a diameter of 17 mm and a thickness of 1 mm through pressing with a load of 400 MPa by the use of a CIP. After molding, the molded body was heated at 700° C. for approximately 3 hours to volatilize the binder, and then was fired at 1100° C. to 1300° C. for 2 hours. The heating rate and the cooling rate during firing were 200° C./hour.

After firing, the sintered body obtained was polished to form into a shape of a 0.4 mm-thick parallel plate. Then, a silver paste was applied and fired to the both surfaces of the plate to form an electrode. After that, in silicon oil at 30° C. to 150° C., an electric field of 10 MV/m was applied to the plate for 15 minutes to carry out a polarization treatment. Thereby, the piezoelectric ceramics of Examples 1-1 to 1-16 were obtained.

The obtained piezoelectric ceramics of Example 1-1 to 1-16 were measured in terms of relative dielectric constant ∈d, electromechanical coupling factor kr in a spreading direction, and amount of displacement when a voltage pulse of 3 MV/m was applied. At that time, the relative dielectric constant ∈d was measured by a LCR meter (Hewlett-Packard's HP4284A) and the electromechanical coupling factor kr was measured by an automatic measuring instrument using an impedance analyzer (Hewlett-Packard's HP4194A) and a desktop computer through a resonance-antiresonance method. The amount of displacement was measured through controlling an eddy-current type noncontact displacement gage, an amplifier, an oscillator, and a multimeter, etc. by the desktop computer and applying voltage to the obtained ceramics in silicon oil. These results are shown in Table 1.

Moreover, as Comparisons 1-1 to 1-6 with the above examples, piezoelectric ceramics were produced under the same conditions as those in the examples except that the composition ratios of the starting materials varied so that the composition ratios a, b and c shown in Chemical Formula 11 in molar ratio had the values shown in Table 1. In Comparisons 1-1 to 1-6, as in the case of the examples, the relative dielectric constant ∈d, the electromechanical coupling factor kr and the amount of displacement when a voltage pulse of 3 MV/m was applied were measured. These results are also shown in Table 1.

Incidentally, Comparison 1-1 comprised only the rhombohedral perovskite structure compound, Comparison 1-2 comprised only the rhombohedral perovskite structure compound and the orthorhombic perovskite structure compound, and Comparisons 1-3 to 1-6 comprised only the rhombohedral perovskite structure compound and the tetragonal perovskite structure compound. Comparison 1-1 corresponds to a comparison with Examples 1-1 to 1-16, Comparison 1-2 corresponds to a comparison with Examples 1-3, 1-8, 1-11 and 1-15, Comparison 1-3 corresponds to a comparison with Examples 1-1 to 1-5, Comparison 1-4 corresponds to a comparison with Examples 1-6 to 1-8, Comparison 1-5 corresponds to a comparison with Examples 1-9 to 1-12, and Comparison 1-6 corresponds to a comparison with Examples 1-13 to 1-16.

As shown in Table 1, according to the examples, a larger amount of displacement could be obtained, compared with the comparisons. That is, it was found that when the first oxide $(Na_{0.5}Bi_{0.5})TiO_3$ as the rhombohedral perovskite structure compound, the second oxide $BaTiO_3$ as the tetragonal perovskite structure compound and the third oxide $NaNbO_3$ as the orthorhombic perovskite structure compound were comprised, or a solid solution including them was comprised, the piezoelectric properties could be improved.

Moreover, according to the results of Examples 1-1 to 1-16, when the composition ratio b of the tetragonal perovskite structure compound or the composition ratio c of the orthorhombic perovskite structure compound increased, the amount of displacement demonstrated a tendency to increase to the maximum value, and then decrease. Thereby, it was found that when the value of b was 0.15 or less, and the value of c was less than 0.15, or when the value of b+c was less than 0.20, the piezoelectric properties could be further improved.

EXAMPLES 2-1 to 2-26

In Examples 2-1 to 2-26, instead of barium carbonate powders, potassium carbonate powders were prepared as a starting material. As shown in Chemical Formula 12, piezoelectric ceramics were produced under the same conditions as those in Examples 1-1 to 1-16, except that $(K_{0.5}Bi_{0.5})TiO_3$ was used instead of the second oxide of $BaTiO_3$ as the tetragonal perovskite structure compound. Further, the composition ratios of the starting materials in Examples 2-1 to 2-26 varied so that the composition ratios a, b and c shown in Chemical Formula 12 in molar ratio after firing had the values shown in Table 2.

Further, as Comparisons 2-1 to 2-7 with these examples, piezoelectric ceramics were produced under the same conditions as those in the examples except that the composition ratios of the starting materials varied so that the composition ratios a, b and c shown in Chemical Formula 12 in molar ratio had the values shown in Table 3. As in the case of Example 1-1, Example 2-1 to 2-26 and Comparisons 2-1 to 2-7 were measured in terms of relative dielectric constant ∈d, electromechanical coupling factor kr and amount of displacement when a voltage pulse of 3 MV/m was applied. These results are shown in Tables 2 and 3.

Incidentally, Comparison 2-1 comprised only the rhombohedral perovskite structure compound and the orthorhombic perovskite structure compound, Comparisons 2-2 to 2-7 comprised only the rhombohedral perovskite structure compound and the tetragonal perovskite structure compound. Moreover, the result of Comparison 1-1 which comprised only the rhombohedral perovskite structure compound and the result of Comparison 1-2 which comprised only the rhombohedral perovskite structure compound and the orthorhombic perovskite structure compound are also shown in Table 3.

Comparison 1-1 corresponds to a comparison with Examples 2-1 to 2-26, Comparison 1-2 corresponds to a comparison with Examples 2-3, 2-8, 2-13, 2-18 and 2-23, Comparison 2-1 corresponds to a comparison with Examples 2-5, 2-10, 2-15, 2-20 and 2-25, Comparison 2-2 corresponds to a comparison with Examples 2-1 to 2-5, Comparison 2-3 corresponds to a comparison with Examples 2-6 to 2-10, Comparison 2-4 corresponds to a comparison with Examples 2-11 to 2-15, Comparison 2-5 corresponds to a comparison with Examples 2-16 to 2-20, Comparison 2-6 corresponds to a comparison with Examples 2-21 to 2-25, and Comparison 2-7 corresponds to a comparison with Example 2-26.

As shown in Tables 2 and 3, according to the examples, compared with the comparisons, all of the examples could obtain a larger relative dielectric constant ∈d. Moreover, Examples 2-1 to 2-4, 2-6 to 2-9, 2-11 to 2-14, 2-16 to 2-19, 2-21 to 2-24, and 2-26 could obtain a larger amount of displacement, compared with the comparisons. In addition, Examples 2-5, 2-10, 2-15, 2-20 and 2-25 could not obtain a good amount of displacement, although they could obtain a further larger relative dielectric constant ∈d. Therefore, if the sinterability is improved through optimizing a firing temperature or adding sintering aids, and thereby the electromechanical coupling factor kr is improved, a larger amount of displacement may be able to be obtained.

That is, it was found that even if $(K_{0.5}Bi_{0.5})TiO_3$ was comprised as the second oxide of the tetragonal perovskite structure compound, like Examples 1-1 to 1-16, the piezoelectric properties could be improved.

Moreover, according to the results of Examples 2-1 to 2-26, when the composition ratio b of the tetragonal perovskite structure compound or the composition ratio c of the orthorhombic perovskite structure compound increased, the amount of displacement demonstrated a tendency to increase to the maximum value, and then decrease. Thereby, it was found that when the value of b was 0.40 or less, and the value of c was less than 0.20, the piezoelectric properties could be improved. Further, it was found that when the value of b was less than 0.40, 0.35 or less, or 0.30 or less, or when the value of c was 0.15 or less, the piezoelectric properties could be further improved.

EXAMPLES 3-1 to 3-4

In Examples 3-1 to 3-4, potassium carbonate powders were further prepared as a starting material. As shown in Chemical Formula 13, piezoelectric ceramics were produced under the same conditions as those in Examples 1-1 to 1-16 except that $BaTiO_3$ and $(K_{0.5}Bi_{0.5})TiO_3$ were comprised as the second oxide of the tetragonal perovskite structure compound. Further, the composition ratios of the starting materials in Examples 3-1 to 3-4 varied so that the composition ratios a, b1, b2 and c shown in Chemical Formula 13 in molar ratio after firing had the values shown in Table 4.

As in the case of Example 1-1, Examples 3-1 to 3-4 were measured in terms of relative dielectric constant ∈d, electromechanical coupling factor kr, and amount of displacement when a voltage pulse of 3 MV/m was applied. These results together with the results of Examples 1-7, 2-7, 2-17, 2-22 and 2-26 are shown in Table 4.

As shown in Table 4, Examples 3-1, 3-2, 3-3, and 3-4 could obtain a larger amount of displacement than Examples 1-7 and 2-7, 2-17, 2-22, and 2-26, respectively. That is, it was found that when $BaTiO_3$ and $(K_{0.5}Bi_{0.5})TiO_3$ were comprised as the second oxide of the tetragonal perovskite structure compound, the piezoelectric properties could be further improved. Moreover, the amount of displacement demonstrated a tendency to increase to the maximum value, and then decrease when the content of potassium bismuth titanate increased. Thereby, it was found that when the composition ratio b1+b2 of the tetragonal perovskite structure compound was 0.40 or less, more specifically 0.35 or less and the most specifically 0.30 or less, the piezoelectric properties could be further improved.

EXAMPLES 4-1 to 4-3

In Examples 4-1 to 4-3, piezoelectric ceramics were produced under the same conditions as those in Example 1-7 except that the starting materials were blended so that the composition ratio x of the first element of the first oxide to the second element of the first oxide, the composition ratio y of the first element of the second oxide to the second element of the second oxide and the composition ratio z of the first element of the third oxide to the second element of the third oxide shown in Chemical Formula 14 had the values shown in Table 5. Further the values of a, b and c were a=0.9, b=0.05 and c=0.05 in molar ratio, and the values of x, y and z were equal, that is, x=y=z. In other words, the value of ax+by+cz shown in Mathematical Formula 5 was the same value as the values of x, y and z.

As in the case of Example 1-7, Examples 4-1 to 4-3 were measured in terms of relative dielectric constant ∈d, electromechanical coupling factor kr and amount of displacement when a voltage pulse of 3 MV/m was applied. These results together with the result of Example 1-7 are shown in Table 5.

As shown in Table 5, compared with Example 1-7, Examples 4-1 to 4-3 could obtain a larger amount of displacement. That is, as shown in Mathematical Formula 5, it was found that when the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide, and the product of the composition ratio c of the third oxide and the composition ratio z of the first element of the third oxide to the second element of the third oxide was within a range from 0.9 to 1.0 inclusive, higher sinterability could be obtained, and the piezoelectric properties could be improved.

EXAMPLES 5-1 to 5-20

Piezoelectric ceramics comprising the first oxide $(Na_{0.5}Bi_{0.5})TiO_3$ as the rhombohedral perovskite structure compound, the second oxide $BaTiO_3$ as the tetragonal perovskite structure compound and the fourth oxide $SrTiO_3$ as the cubic perovskite structure compound were produced as in the case of Examples 1-1 to 1-16. Further, as the starting materials, bismuth oxide powders, sodium carbonate powders, barium carbonate powders, strontium carbonate powders and titanium oxide powders were prepared. The composition ratios of the starting materials in Examples 5-1 to 5-20 varied so that the composition ratios a, b and d shown in Chemical Formula 15 in molar ratio after firing had the values shown in Table 6.

As in the case of Examples 1-1 to 1-16, the obtained piezoelectric ceramics of Examples 5-1 to 5-20 were measured in terms of relative dielectric constant ∈d, electromechanical coupling factor kr in a spreading direction, and amount of displacement when a voltage pulse of 3 MV/m was applied. These results are shown in Table 6.

Moreover, as Comparisons 5-1 to 5-7 with the examples, piezoelectric ceramics were produced under the same conditions as those in the examples except that the composition ratios of the starting materials varied so that the composition ratios a, b and d shown in Chemical Formula 15 in molar ratio had the values shown in Table 7. In Comparisons 5-1 to 5-7, as in the case of the examples, the relative dielectric constant ∈d, the electromechanical coupling factor kr and the amount of displacement when a voltage pulse of 3 MV/m was applied were measured. These results are shown in Table 7.

Moreover, Comparison 5-1 comprised only the rhombohedral perovskite structure compound, Comparisons 5-2 and 5-3 comprised only the rhombohedral perovskite structure compound and the cubic perovskite structure compound, Comparisons 5-4 to 5-7 comprised only the rhombohedral perovskite structure compound and the tetragonal perovskite structure compound. Comparison 5-1 corresponds to a comparison with Examples 5-1 to 5-20, Comparison 5-2 corresponds to a comparison with Examples 5-3, 5-8, 5-13 and 5-18, Comparison 5-3 corresponds to a comparison with Example 5-5, 5-10, 5-15 and 5-20, Comparison 5-4 corresponds to a comparison with Examples 5-1 to 5-5, Comparison 5-5 corresponds to a comparison with Examples 5-6 to 5-10, Comparison 5-6 corresponds to a comparison with Examples 5-11 to 5-15, and Comparison 5-7 corresponds to a comparison with Examples 5-16 to 5-20.

As shown in Tables 6 and 7, according to the examples, compared with the comparisons, a larger amount of displacement could be obtained. That is, it was found that when the first oxide $(Na_{0.5}Bi_{0.5})TiO_3$ as the rhombohedral perovskite structure compound, the second oxide $BaTiO_3$ as the tetragonal perovskite structure compound and the fourth oxide $SrTiO_3$ as the cubic perovskite structure compound were comprised, or a solid solution including them was comprised, the piezoelectric properties could be improved.

Moreover, in the results of Examples 5-1 to 5-20, when the composition ratio b of the tetragonal perovskite structure compound or the composition ratio d of the cubic perovskite structure compound increased, the amount of displacement demonstrated a tendency to increase to the maximum value, and then decrease. Thereby, it was found that when the value of b was 0.15 or less, and the value of d was 0.20 or less, the piezoelectric properties could be further improved. Moreover, it was found that it was more preferable that the value of b was 0.1 or less, or the value of d was 0.15 or less.

EXAMPLES 6-1 to 6-20

In Examples 6-1 to 6-20, instead of barium carbonate powders, potassium carbonate powders were prepared as a starting material. As shown in Chemical Formula 16, piezoelectric ceramics were produced under the same conditions as those in Examples 5-1 to 5-20 except that $(K_{0.5}Bi_{0.5})TiO_3$ was used instead of the second oxide of $BaTiO_3$ as the tetragonal perovskite structure compound. Further, the composition ratios of the starting materials in Examples 6-1 to 6-20 varied so that the composition ratios a, b and d shown in Chemical Formula 16 in molar ratio after firing had the values shown in Table 8.

Further, as Comparisons 6-1 to 6-4 with the examples, the piezoelectric ceramics were produced under the same conditions as those in the examples except that the composition ratios of the starting materials varied so that the composition ratios a, b and d shown in Chemical Formula 16 in molar ratio had the values shown in Table 9. As in the case of Example 5-1, Examples 6-1 to 6-20 and Comparisons 6-1 to 6-4 were measured in terms of relative dielectric constant ∈d, electromechanical coupling factor kr and amount of displacement when a voltage pulse of 3 MV/m was applied. These results are shown in Tables 8 and 9.

Incidentally, Comparisons 6-1 to 6-4 comprised only the rhombohedral perovskite structure compound and the tetragonal perovskite structure compound. Further, in Table 9, the result of Comparison 5-1 which comprised only the rhombohedral perovskite structure compound and the results of Comparisons 5-2 and 5-3 which comprised only the rhombohedral perovskite structure compound and the cubic perovskite structure compound are also shown.

Comparison 5-1 corresponds to a comparison with Examples 6-1 to 6-20, Comparison 5-2 corresponds to a comparison with Examples 6-3, 6-8, 6-13 and 6-18, Comparison 5-3 corresponds to a comparison with Examples 6-5, 6-10, 6-15 and 6-20, Comparison 6-1 corresponds to a comparison with Examples 6-1 to 6-5, Comparison 6-2 corresponds to a comparison with Examples 6-6 to 6-10, Comparison 6-3 corresponds to a comparison with Examples 6-11 to 6-15, and Comparison 6-4 corresponds to a comparison with Examples 6-16 to 6-20.

As shown in Tables 8 and 9, according to the examples, compared with the comparisons, a larger amount of displacement could be obtained. That is, it was found that even if $(K_{0.5}Bi_{0.5})TiO_3$ was comprised as the second oxide of the tetragonal perovskite structure compound, like Examples 5-1 to 5-20, the piezoelectric properties could be improved. Moreover, in the results of Examples 6-1 to 6-20, when the composition ratio b of the tetragonal perovskite structure compound or the composition ratio d of the cubic perovskite structure compound increased, the amount of displacement demonstrated a tendency to increase to the maximum value, and then decrease. Thereby, it was found that when the value of b was 0.20 or less, and the value of d was 0.20 or less, the piezoelectric properties could be improved. Moreover, it was found that it was more preferable that the value of b was 0.10 or over, or the value of d was 0.15 or less, more specifically 0.10 or less.

EXAMPLES 7-1 to 7-3

In Examples 7-1 to 7-3, piezoelectric ceramics were produced under the same conditions as those in Example 5-7 except that the starting materials were blended so that the composition ratio x of the first element of the first oxide to the second element of the first oxide, the composition ratio y of the first element of the second oxide to the second element of the second oxide and the composition ratio w of the first element of the fourth oxide to the second element of the fourth oxide shown in Chemical Formula 17 had the values shown in Table 10. Further, the values of a, b and d were a=0.9, b=0.05 and d=0.05 in molar ratio, and the values of x, y and w were equal, that is, x=y=w. In other words, the value of ax+by+dw shown in Mathematical Formula 6 was the same value as the values of x, y and w.

As in the case of Example 5-7, Examples 7-1 to 7-3 were measured in terms of relative dielectric constant ∈d, electromechanical coupling factor kr and amount of displacement when a voltage pulse of 3 MV/m was applied. These results together with the result of Example 5-7 are shown in Table 10.

As shown in Table 10, compared with Example 5-7, Examples 7-1 to 7-3 could obtain a larger amount of displacement. That is, as shown in Mathematical Formula 6, it was found that when the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide, and the product of the composition ratio d of the fourth oxide and the composition ratio w of the first element of the fourth oxide to the second element of the fourth oxide was within a range from 0.9 to 1.0 inclusive, higher sinterability could be obtained, and the piezoelectric properties could be improved.

In the above examples, descriptions are given with some specific examples. However, even if any other rhombohedral perovskite structure compound, any other tetragonal perovskite structure compound, any other orthorhombic perovskite structure compound or any other cubic perovskite structure compound is comprised, the same result as in the above examples can be obtained. Although the present invention is described referring to the embodiments and some examples, the invention is not limited to the embodiments and the examples, and is applicable to various modifications. For example, in the above embodiments and the examples, the first oxide, the second oxide, the third oxide and the fourth oxide are described as the rhombohedral perovskite structure compound, the tetragonal perovskite structure compound, the orthorhombic perovskite structure compound and the cubic perovskite structure compound, respectively, although any other compounds having these crystal structures may be comprised.

Moreover, in the above embodiments and the examples, the first oxide, the second oxide, the third oxide and the fourth oxide are described referring to the specific examples, although any materials other than the above-described oxides may be comprised.

Further, in the above embodiments, the crystal structures of the first oxide, the second oxide, the third oxide and the fourth oxide are described, although, needless to say, as long as oxides having the above compositions are comprised, or a solid solution including them is comprised, they are within a scope of the invention.

In addition, in the above embodiments and the examples, descriptions are given of the case where the rhombohedral perovskite structure compound, the tetragonal perovskite structure compound and the orthorhombic perovskite structure compound are comprised, or the case where the rhombohedral perovskite structure compound, the tetragonal perovskite structure compound and the cubic perovskite structure compound are comprised, however, any other compounds having any other crystal structures may be added to them.

Still further, in the invention, any elements other than the elements forming the rhombohedral perovskite structure compound, the tetragonal perovskite structure compound and the orthorhombic perovskite structure compound may be included as elements forming impurities or compounds having any other crystal structures. Further, any elements other than the elements forming the rhombohedral perovskite structure compound, the tetragonal perovskite structure compound and the cubic perovskite structure compound may be included as elements forming impurities or compounds having any other crystal structures. As such elements, there are, for example, strontium (Sr), magnesium (Mg), lithium (Li), zirconium (Zr), hafnium (Hf), tantalum (Ta), calcium (Ca), potassium (K) and rare earth elements.

As described above, in the piezoelectric ceramic according to the invention, since three kinds or more of perovskite structure compounds having different crystal structures or a solid solution including these compounds is comprised, or the first oxide, the second oxide and the third oxide or a solid solution including these oxides is comprised, compared with a one- or two-component based piezoelectric ceramic, the electromechanical coupling factor and the relative dielectric constant can be improved, and accordingly the amount of displacement can be improved. Therefore, the piezoelectric ceramic including no lead or a small amount of lead can have higher applicability. That is, the piezoelectric ceramic can minimize the volatilization of lead during firing and the release of lead into the environment after the piezoelectric ceramic as a piezoelectric ceramic product is distributed into the market and then discarded.

Specifically, in the piezoelectric ceramic according to an aspect of the invention, since the rhombohedral perovskite structure compound, the tetragonal perovskite structure compound and the orthorhombic perovskite structure compound, or the rhombohedral perovskite structure compound, the tetragonal perovskite structure compound and the cubic perovskite structure compound are comprised as the perovskite structure compounds, higher piezoelectric properties can be obtained.

Moreover, in the piezoelectric ceramic according to another aspect of the invention, as shown in Chemical Formula 1 or Chemical Formula 3, the composition ratios a, b and c are within a range satisfying a+b+c=1, 0.40<a≦0.99, 0<b≦0.40, 0<c<0.20, respectively, or as shown in Chemical Formula 2 or Chemical Formula 4, the composition ratios a, b and d are within a range satisfying a+b+d=1, 0.60≦a≦0.99, 0<b≦0.20, 0<d≦0.20, respectively, so that higher piezoelectric properties can be obtained.

Further, in the piezoelectric ceramic according to a still another aspect of the invention, as shown in Mathematical Formula 1 or Mathematical Formula 2, the sum of the products of the composition ratio of each of three kinds of compounds and the composition ratio of an element at the A-site to an element at the B-site in the each of three kinds of compounds is within a range from 0.9 to 1.0 inclusive, or as shown in Mathematical Formula 3, the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide and the product of the composition ratio c of the third oxide and the composition ratio z of the first element of the third oxide to the second element of the third oxide is within a range from 0.9 to 1.0 inclusive, or as shown in Mathematical Formula 4, the sum of the product of the composition ratio a of the first oxide and the composition ratio x of the first element of the first oxide to the second element of the first oxide, the product of the composition ratio b of the second oxide and the composition ratio y of the first element of the second oxide to the second element of the second oxide, and the product of the composition ratio d of the fourth oxide and the composition ratio w of the first element of the fourth oxide to the second element of the fourth oxide is within a range from 0.9 to 1.0 inclusive, so that higher sinterability can be obtained and the piezoelectric properties can be further improved.

Obviously many modifications and variations of the present invention are possible in the light of the above teachings. It is therefore to be understood that within the scope of the appended claims the invention may be practiced otherwise than as specifically described.

$$aA + bB + cC \quad \text{(Chemical Formula 1)}$$

$$\begin{pmatrix} \text{where } A \text{ represents a rhombohedral perovskite structure} \\ \text{compound, } B \text{ represents a tetragonal perovskite structure} \\ \text{compound and } C \text{ represents an orthorhombic perovskite structure} \\ \text{compound. The value of } a, b \text{ and } c \text{ are within a range satisfying} \\ a + b + c = 1, \ 0.40 < sa \leq 0.99, \ 0 < b \leq 0.40, \ 0 < c < 0.20, \text{ respectively.} \end{pmatrix}$$

$$aA + bB + dD \quad \text{(Chemical Formula 2)}$$

$$\begin{pmatrix} \text{where } A \text{ represents a rhombohedral perovskite structure} \\ \text{compound, } B \text{ represents a tetragonal perovskite structure} \\ \text{compound and } D \text{ represents a cubic perovskite structure} \\ \text{compound. The values of } a, b \text{ and } d \text{ are within a range satisfying} \\ a + b + d = 1, \ 0.60 \leq a \leq 0.99, \ 0 < b \leq 0.20, \ 0, < d \leq 0.20, \text{ respectively.} \end{pmatrix}$$

$$aA + bB + cC \quad \text{(Chemical Formula 3)}$$

$$\begin{pmatrix} \text{where } A \text{ represents a first oxide, } B \text{ represents a second oxide and} \\ C \text{ represents a third oxide. The values of } a, b \text{ and } c \text{ are within a} \\ \text{range satisfying } a + b + c = 1, \ 0.40 < a \leq 0.99, \ 0 < b \leq 0.40, \ 0 < c < 0.20, \\ \text{respectively.} \end{pmatrix}$$

-continued $$aA + bB + dD \quad \text{(Chemical Formula 4)}$$

$$\begin{pmatrix} \text{where } A \text{ represents a first oxide, } B \text{ represents a second oxide, and} \\ D \text{ represents a fourth oxide. The values of } a, b \text{ and } d \text{ are within} \\ \text{a range satisfying } a+b+d=1,\ 0.60 \leq a \leq 0.99,\ 0 < b \leq 0.20,\ 0 < d \leq 0.20, \\ \text{respectively.} \end{pmatrix}$$

$$A1_x A2 O_3 \quad \text{(Chemical Formula 5)}$$

$$B1_y B2 O_3 \quad \text{(Chemical Formula 6)}$$

$$C1_z C2 O_3 \quad \text{(Chemical Formula 7)}$$

$$aA + bB + cC \quad \text{(Chemical Formula 8)}$$

$$D1_w D2 O_3 \quad \text{(Chemical Formula 9)}$$

$$aA + bB + dD \quad \text{(Chemical Formula 10)}$$

$$a(Na_{0.5}Bi_{0.5})TiO_3 + bBaTiO_3 + cNaNbO_3 \quad \text{(Chemical Formula 11)}$$

$$a(Na_{0.5}Bi_{0.5})TiO_3 + b(K_{0.5}Bi_{0.5})TiO_3 + cNaNbO_3 \quad \text{(Chemical Formula 12)}$$

$$a(Na_{0.5}Bi_{0.5})TiO_3 + b1BaTiO_3 + b2(K_{0.5}Bi_{0.5})TiO_3 + cNaNbO_3 \quad \text{(Chemical Formula 13)}$$

$$a(Na_{0.5}Bi_{0.5})_x TiO_3 + bBa_y TiO_3 + cNa_z NbO_3 \quad \text{(Chemical Formula 14)}$$

$$a(Na_{0.5}Bi_{0.5})TiO_3 + bBaTiO_3 + dSrTiO_3 \quad \text{(Chemical Formula 15)}$$

$$a(Na_{0.5}Bi_{0.5})TiO_3 + b(K_{0.5}Bi_{0.5})TiO_3 + dSrTiO_3 \quad \text{(Chemical Formula 16)}$$

$$a(Na_{0.5}Bi_{0.5})_x TiO_3 + bBa_y TiO_3 dSr_w TiO_3 \quad \text{(Chemical Formula 17)}$$

$$0.9 \leq ax + by + cz \leq 1.0 \quad \text{(Mathematical Formula 1)}$$

$$\begin{pmatrix} \text{where } a, b \text{ and } c \text{ represnt the composition ratio of a} \\ \text{rhombohedral perovskite structure compound, a tetragonal} \\ \text{perovskite structure compound and an orthorhombic perovskite} \\ \text{structure compound in molar ratio, respectively, and } x, y \text{ and } z \\ \text{each represent the composition ratio of an element at the } A\text{-site} \\ \text{to an element at the } B\text{-site in molar ratio in the rhomabohedral} \\ \text{preovskite structure compound, the tetragonal perovskite} \\ \text{structure compound and the orthorhombic perovskite structure} \\ \text{compound, respectively.} \end{pmatrix}$$

$$0.9 \leq ax + by + dw \leq 1.0 \quad \text{(Mathematical Formula 2)}$$

$$\begin{pmatrix} \text{where } a, b \text{ and } d \text{ represent the composition ratio of a} \\ \text{rhombohedral perovskite structure compound, a tetragonal} \\ \text{perovskite structure compound and a cubic perovskite structure} \\ \text{compound in molar ratio, respectively, and } x, y \text{ and } w \text{ each} \\ \text{represent the composition ratio of an element at the } A\text{-site to an} \\ \text{element at the } B\text{-site in molar ratio in the rhombohedral} \\ \text{perovskite structure compound, the tetragonal perovskite} \\ \text{structure compound and the cubic perovskite structure compound,} \\ \text{respectively.} \end{pmatrix}$$

-continued $$0.9 \leq ax + by + cz \leq 1.0 \quad \text{(Mathematical Formula 3)}$$

where $a, b$ and $c$ represent the composition ratio of first oxide, a second oxide and a third oxide in molar ratio, respectively, and $x$ represents the composition ratio of a first element of the first oxide to a second element of the first oxide in molar ratio, $y$ represents the composition ratio of a first element of the second oxide to a second element of the second oxide in molar ratio, and $z$ represents the composition ratio of a first elelment of the third oxide to a second element of the third oxide in molar ratio.

$$0.9 \leq ax + by + dw \leq 1.0 \quad \text{(Mathematical Formula 4)}$$

where $a, b$ and $d$ represent the composition ratio of the first oxide, the second oxide and a fourth oxide in molar ratio, respectively, and $x$ represents the composition ratio of the first element of the first oxide to the second element of the first oxide in molar ratio, $y$ represents the compostion ratio of the first element of the second oxide to the second element of the second oxide in molar ratio, and $w$ represents the composition ratio of a first element of the fourth oxide to a second element of the fourth oxide in molar ratio.

$$0.9 \leq ax + by + cz \leq 1.0 \quad \text{(Mathematical Formula 5)}$$

$$0.9 \leq ax + by + dw \leq 1.0 \quad \text{(Mathematical Formula 6)}$$

TABLE 1

| | COMPOSITION RATIO a OF RHOMBO-HEDRAL $(NaB_1)T_1O_3$ | COMPOSITION RATIO b OF TETRAGONAL $BaT_1O_3$ | COMPOSITION RATIO c OF ORTHO-RHOMBIC $NaNbO_3$ | RELATIVE DIELECTRIC CONSTANT $\epsilon d$ | ELECTRO MECHANICAL COUPLING FACTOR kr (%) | AMOUNT OF DISPLACEMENT (%) |
|---|---|---|---|---|---|---|
| EXAMPLE 1-1 | 0.98 | 0.01 | 0.01 | 984 | 23.7 | 0.017 |
| EXAMPLE 1-2 | 0.95 | 0.01 | 0.04 | 1023 | 25.5 | 0.018 |
| EXAMPLE 1-3 | 0.90 | 0.01 | 0.09 | 1036 | 24.1 | 0.017 |
| EXAMPLE 1-4 | 0.85 | 0.01 | 0.14 | 998 | 22.9 | 0.016 |
| EXAMPLE 1-5 | 0.80 | 0.01 | 0.19 | 983 | 16.2 | 0.011 |
| EXAMPLE 1-6 | 0.94 | 0.05 | 0.01 | 1494 | 28.0 | 0.024 |
| EXAMPLE 1-7 | 0.90 | 0.05 | 0.05 | 1569 | 25.5 | 0.022 |
| EXAMPLE 1-8 | 0.85 | 0.05 | 0.10 | 1641 | 24.8 | 0.022 |
| EXAMPLE 1-9 | 0.89 | 0.10 | 0.01 | 1536 | 15.8 | 0.014 |
| EXAMPLE 1-10 | 0.85 | 0.10 | 0.05 | 1970 | 17.4 | 0.017 |
| EXAMPLE 1-11 | 0.80 | 0.10 | 0.10 | 1675 | 16.9 | 0.015 |
| EXAMPLE 1-12 | 0.75 | 0.10 | 0.15 | 1729 | 16.0 | 0.015 |
| EXAMPLE 1-13 | 0.84 | 0.15 | 0.01 | 1117 | 15.5 | 0.012 |
| EXAMPLE 1-14 | 0.80 | 0.15 | 0.05 | 1193 | 15.9 | 0.012 |
| EXAMPLE 1-15 | 0.75 | 0.15 | 0.10 | 1094 | 16.4 | 0.012 |
| EXAMPLE 1-16 | 0.70 | 0.15 | 0.15 | 954 | 16.0 | 0.012 |
| COMPARISON 1-1 | 1.00 | 0.00 | 0.00 | 644 | 15.9 | 0.009 |
| COMPARISON 1-2 | 0.90 | 0.00 | 0.10 | 756 | 15.7 | 0.010 |
| COMPARISON 1-3 | 0.99 | 0.01 | 0.00 | 672 | 17.0 | 0.010 |
| COMPARISON 1-4 | 0.95 | 0.05 | 0.00 | 1144 | 25.7 | 0.019 |
| COMPARISON 1-5 | 0.90 | 0.10 | 0.00 | 1014 | 14.3 | 0.010 |
| COMPARISON 1-6 | 0.85 | 0.15 | 0.00 | 1006 | 13.8 | 0.010 |

TABLE 2

|  | COMPOSITION RATIO a OF RHOMBO-HEDRAL $(NaB_1)T_1O_3$ | COMPOSITION RATIO b OF TETRAGONAL $(KB_1)T_1O_3$ | COMPOSITION RATIO c OF ORTHO-RHOMBIC $NaNbO_3$ | RELATIVE DIELECTRIC CONSTANT $\epsilon d$ | ELECTRO MECHANICAL COUPLING FACTOR kr (%) | AMOUNT OF DISPLACEMENT (%) |
|---|---|---|---|---|---|---|
| EXAMPLE 2-1 | 0.94 | 0.05 | 0.01 | 772 | 19.6 | 0.013 |
| EXAMPLE 2-2 | 0.90 | 0.05 | 0.05 | 1089 | 18.9 | 0.014 |
| EXAMPLE 2-3 | 0.85 | 0.05 | 0.10 | 1455 | 19.1 | 0.017 |
| EXAMPLE 2-4 | 0.80 | 0.05 | 0.15 | 1570 | 18.3 | 0.017 |
| EXAMPLE 2-5 | 0.75 | 0.05 | 0.20 | 1691 | — | — |
| EXAMPLE 2-6 | 0.89 | 0.10 | 0.01 | 860 | 21.6 | 0.015 |
| EXAMPLE 2-7 | 0.85 | 0.10 | 0.05 | 1170 | 19.3 | 0.015 |
| EXAMPLE 2-8 | 0.80 | 0.10 | 0.10 | 1664 | 19.0 | 0.018 |
| EXAMPLE 2-9 | 0.75 | 0.10 | 0.15 | 1725 | 18.7 | 0.018 |
| EXAMPLE 2-10 | 0.70 | 0.10 | 0.20 | 1752 | — | — |
| EXAMPLE 2-11 | 0.84 | 0.15 | 0.01 | 1193 | 27.0 | 0.021 |
| EXAMPLE 2-12 | 0.80 | 0.15 | 0.05 | 1830 | 27.9 | 0.027 |
| EXAMPLE 2-13 | 0.75 | 0.15 | 0.10 | 1956 | 28.9 | 0.029 |
| EXAMPLE 2-14 | 0.70 | 0.15 | 0.15 | 2218 | 27.5 | 0.030 |
| EXAMPLE 2-15 | 0.65 | 0.15 | 0.20 | 2347 | — | — |
| EXAMPLE 2-16 | 0.79 | 0.20 | 0.01 | 1310 | 27.2 | 0.023 |
| EXAMPLE 2-17 | 0.75 | 0.20 | 0.05 | 1946 | 26.8 | 0.027 |
| EXAMPLE 2-18 | 0.70 | 0.20 | 0.10 | 2103 | 27.7 | 0.029 |
| EXAMPLE 2-19 | 0.65 | 0.20 | 0.15 | 2217 | 26.6 | 0.029 |
| EXAMPLE 2-20 | 0.60 | 0.20 | 0.20 | 2268 | — | — |
| EXAMPLE 2-21 | 0.69 | 0.30 | 0.01 | 1367 | 23.8 | 0.020 |
| EXAMPLE 2-22 | 0.65 | 0.30 | 0.05 | 1994 | 23.6 | 0.024 |
| EXAMPLE 2-23 | 0.60 | 0.30 | 0.10 | 2116 | 24.1 | 0.025 |
| EXAMPLE 2-24 | 0.55 | 0.30 | 0.15 | 2241 | 23.3 | 0.025 |
| EXAMPLE 2-25 | 0.50 | 0.30 | 0.20 | 2323 | — | — |
| EXAMPLE 2-26 | 0.55 | 0.40 | 0.05 | 1935 | 15.2 | 0.014 |

Note:
In the table, a symbol "—" represents "not measurable".

TABLE 3

|  | COMPOSITION RATIO a OF RHOMBO-HEDRAL $(NaB_1)T_1O_3$ | COMPOSITION RATIO b OF TETRAGONAL $(KB_1)T_1O_3$ | COMPOSITION RATIO c OF ORTHO-RHOMBIC $NaNbO_3$ | RELATIVE DIELECTRIC CONSTANT $\epsilon d$ | ELECTRO MECHANICAL COUPLING FACTOR kr (%) | AMOUNT OF DISPLACEMENT (%) |
|---|---|---|---|---|---|---|
| COMPARISON 1-1 | 1.00 | 0.00 | 0.00 | 644 | 15.9 | 0.009 |
| COMPARISON 1-2 | 0.90 | 0.00 | 0.10 | 756 | 15.7 | 0.010 |
| COMPARISON 2-1 | 0.80 | 0.00 | 0.20 | 798 | 16.3 | 0.010 |
| COMPARISON 2-2 | 0.95 | 0.05 | 0.00 | 673 | 19.8 | 0.012 |
| COMPARISON 2-3 | 0.90 | 0.10 | 0.00 | 685 | 22.6 | 0.014 |
| COMPARISON 2-4 | 0.85 | 0.15 | 0.00 | 827 | 29.0 | 0.019 |
| COMPARISON 2-5 | 0.80 | 0.20 | 0.00 | 911 | 27.2 | 0.018 |
| COMPARISON 2-6 | 0.70 | 0.30 | 0.00 | 986 | 24.1 | 0.017 |
| COMPARISON 2-7 | 0.60 | 0.40 | 0.00 | 885 | 19.9 | 0.013 |

TABLE 4

|  | COMPOSITION RATIO a OF RHOMBO-HEDRAL $(NaB_1)T_1O_3$ | TETRAGONAL | | COMPOSITION RATIO c OF ORTHO-RHOMBIC $NaNbO_3$ | RELATIVE DIELECTRIC CONSTANT $\epsilon d$ | ELECTRO MECHANICAL COUPLING FACTOR kr (%) | AMOUNT OF DISPLACEMENT (%) |
|---|---|---|---|---|---|---|---|
|  |  | COMPOSITION RATIO b1 OF $BaT_1O_3$ | COMPOSITION RATIO b2 OF $(KB_1)T_1O_3$ |  |  |  |  |
| EXAMPLE 3-1 | 0.80 | 0.05 | 0.1 | 0.05 | 1720 | 34.9 | 0.032 |
| EXAMPLE 3-2 | 0.70 | 0.05 | 0.2 | 0.05 | 1783 | 42.1 | 0.040 |
| EXAMPLE 3-3 | 0.60 | 0.05 | 0.3 | 0.05 | 1685 | 27.6 | 0.025 |
| EXAMPLE 3-4 | 0.50 | 0.05 | 0.4 | 0.05 | 1311 | 18.3 | 0.015 |
| EXAMPLE 1-7 | 0.90 | 0.05 | 0.0 | 0.05 | 1569 | 25.5 | 0.022 |
| EXAMPLE 2-7 | 0.85 | 0.00 | 0.1 | 0.05 | 1170 | 19.3 | 0.015 |
| EXAMPLE 2-17 | 0.75 | 0.00 | 0.2 | 0.05 | 1946 | 26.8 | 0.027 |
| EXAMPLE 2-22 | 0.65 | 0.00 | 0.3 | 0.05 | 1994 | 23.6 | 0.024 |
| EXAMPLE 2-26 | 0.55 | 0.00 | 0.4 | 0.05 | 1935 | 15.2 | 0.014 |

TABLE 5

| | COMPOSITION RATIO a OF RHOMBO-HEDRAL $(NaB_1)T_1O_3$ | COMPOSITION RATIO b OF TETRAGONAL $BaT_1O_3$ | COMPOSITION RATIO c OF ORTHO-RHOMBIC $NaNbO_3$ | ax + by + cz | RELATIVE DIELECTRIC CONSTANT $\epsilon d$ | ELECTRO-MECHANICAL COUPLING FACTOR kr (%) | AMOUNT OF DISPLACE-MENT (%) |
|---|---|---|---|---|---|---|---|
| EXAMPLE 1-7 | 0.9 | 0.05 | 0.05 | 1.00 | 1569 | 25.5 | 0.022 |
| EXAMPLE 4-1 | 0.9 | 0.05 | 0.05 | 0.99 | 1614 | 26.8 | 0.024 |
| EXAMPLE 4-2 | 0.9 | 0.05 | 0.05 | 0.09 | 1593 | 28.2 | 0.025 |
| EXAMPLE 4-3 | 0.9 | 0.05 | 0.05 | 0.90 | 1601 | 25.4 | 0.023 |

TABLE 6

| | COMPOSITION RATIO a OF RHOMBO-HEDRAL $(NaB_1)T_1O_3$ | COMPOSITION RATIO b OF TETRAGONAL $BaT_1O_3$ | COMPOSITION RATIO d OF CUBIC $SrT_1O_3$ | RELATIVE DIELECTRIC CONSTANT $\epsilon d$ | ELECTRO-MECHANICAL COUPLING FACTOR kr (%) | AMOUNT OF DISPLACEMENT (%) |
|---|---|---|---|---|---|---|
| EXAMPLE 5-1 | 0.98 | 0.01 | 0.01 | 992 | 24.1 | 0.017 |
| EXAMPLE 5-2 | 0.95 | 0.01 | 0.04 | 1119 | 30.4 | 0.023 |
| EXAMPLE 5-3 | 0.90 | 0.01 | 0.09 | 1352 | 27.3 | 0.023 |
| EXAMPLE 5-4 | 0.85 | 0.01 | 0.14 | 1507 | 25.9 | 0.023 |
| EXAMPLE 5-5 | 0.80 | 0.01 | 0.19 | 1576 | 23.3 | 0.021 |
| EXAMPLE 5-6 | 0.94 | 0.05 | 0.01 | 1404 | 30.3 | 0.026 |
| EXAMPLE 5-7 | 0.90 | 0.05 | 0.05 | 1668 | 34.0 | 0.032 |
| EXAMPLE 5-8 | 0.85 | 0.05 | 0.10 | 1848 | 27.1 | 0.027 |
| EXAMPLE 5-9 | 0.80 | 0.05 | 0.15 | 1954 | 23.6 | 0.024 |
| EXAMPLE 5-10 | 0.75 | 0.05 | 0.20 | 2098 | 18.4 | 0.020 |
| EXAMPLE 5-11 | 0.89 | 0.10 | 0.01 | 1498 | 27.6 | 0.024 |
| EXAMPLE 5-12 | 0.85 | 0.10 | 0.05 | 1822 | 30.2 | 0.030 |
| EXAMPLE 5-13 | 0.80 | 0.10 | 0.10 | 1975 | 28.5 | 0.029 |
| EXAMPLE 5-14 | 0.75 | 0.10 | 0.15 | 2113 | 21.6 | 0.021 |
| EXAMPLE 5-15 | 0.70 | 0.10 | 0.20 | 2148 | 17.2 | 0.018 |
| EXAMPLE 5-16 | 0.84 | 0.15 | 0.01 | 1207 | 26.9 | 0.021 |
| EXAMPLE 5-17 | 0.80 | 0.15 | 0.05 | 1328 | 27.1 | 0.023 |
| EXAMPLE 5-18 | 0.75 | 0.15 | 0.10 | 1274 | 25.2 | 0.021 |
| EXAMPLE 5-19 | 0.70 | 0.15 | 0.15 | 1339 | 20.5 | 0.017 |
| EXAMPLE 5-20 | 0.65 | 0.15 | 0.20 | 1300 | 17.3 | 0.014 |

TABLE 7

| | COMPOSITION RATIO a OF RHOMBO-HEDRAL $(NaB_1)T_1O_3$ | COMPOSITION RATIO b OF TETRAGONAL $BaT_1O_3$ | COMPOSITION RATIO d OF CUBIC $SrTiO_3$ | RELATIVE DIELECTRIC CONSTANT $\epsilon d$ | ELECTRO-MECHANICAL COUPLING FACTOR kr (%) | AMOUNT OF DISPLACEMENT (%) |
|---|---|---|---|---|---|---|
| COMPARISON 5-1 | 1.00 | 0.00 | 0.00 | 644 | 15.9 | 0.009 |
| COMPARISON 5-2 | 0.90 | 0.00 | 0.10 | 985 | 18.2 | 0.013 |
| COMPARISON 5-3 | 0.80 | 0.00 | 0.20 | 1113 | 16.3 | 0.013 |
| COMPARISON 5-4 | 0.99 | 0.01 | 0.00 | 672 | 17.0 | 0.010 |
| COMPARISON 5-5 | 0.95 | 0.05 | 0.00 | 1144 | 25.7 | 0.019 |
| COMPARISON 5-6 | 0.90 | 0.10 | 0.00 | 1014 | 14.3 | 0.010 |
| COMPARISON 5-7 | 0.85 | 0.15 | 0.00 | 1006 | 13.8 | 0.010 |

TABLE 8

| | COMPOSITION RATIO a OF RHOMBO-HEDRAL $(NaB_1)T_1O_3$ | COMPOSITION RATIO b OF TETRAGONAL $(KB_1)T_1O_3$ | COMPOSITION RATIO d OF CUBIC $SrT_1O_3$ | RELATIVE DIELECTRIC CONSTANT $\epsilon d$ | ELECTRO-MECHANICAL COUPLING FACTOR kr (%) | AMOUNT OF DISPLACEMENT (%) |
|---|---|---|---|---|---|---|
| EXAMPLE 6-1 | 0.94 | 0.05 | 0.01 | 734 | 22.4 | 0.014 |
| EXAMPLE 6-2 | 0.90 | 0.05 | 0.05 | 907 | 23.6 | 0.016 |
| EXAMPLE 6-3 | 0.85 | 0.05 | 0.10 | 1382 | 24.7 | 0.021 |
| EXAMPLE 6-4 | 0.80 | 0.05 | 0.15 | 1528 | 23.4 | 0.021 |
| EXAMPLE 6-5 | 0.75 | 0.05 | 0.20 | 1735 | 21.9 | 0.021 |
| EXAMPLE 6-6 | 0.89 | 0.10 | 0.01 | 811 | 24.1 | 0.016 |
| EXAMPLE 6-7 | 0.85 | 0.10 | 0.05 | 1017 | 23.9 | 0.018 |
| EXAMPLE 6-8 | 0.80 | 0.10 | 0.10 | 1624 | 24.6 | 0.023 |

TABLE 8-continued

|  | COMPOSITION RATIO a OF RHOMBO-HEDRAL $(NaB_1)T_1O_3$ | COMPOSITION RATIO b OF TETRAGONAL $(KB_1)T_1O_3$ | COMPOSITION RATIO d OF CUBIC $SrT_1O_3$ | RELATIVE DIELECTRIC CONSTANT $\epsilon d$ | ELECTRO-MECHANICAL COUPLING FACTOR kr (%) | AMOUNT OF DISPLACEMENT (%) |
|---|---|---|---|---|---|---|
| EXAMPLE 6-9 | 0.75 | 0.10 | 0.15 | 2149 | 22.3 | 0.024 |
| EXAMPLE 6-10 | 0.70 | 0.10 | 0.20 | 2433 | 20.0 | 0.023 |
| EXAMPLE 6-11 | 0.84 | 0.15 | 0.01 | 803 | 30.2 | 0.020 |
| EXAMPLE 6-12 | 0.80 | 0.15 | 0.05 | 1416 | 32.2 | 0.028 |
| EXAMPLE 6-13 | 0.75 | 0.15 | 0.10 | 1753 | 32.0 | 0.031 |
| EXAMPLE 6-14 | 0.70 | 0.15 | 0.15 | 2080 | 29.5 | 0.030 |
| EXAMPLE 6-15 | 0.65 | 0.15 | 0.20 | 2092 | 26.8 | 0.028 |
| EXAMPLE 6-16 | 0.79 | 0.20 | 0.01 | 1229 | 26.7 | 0.022 |
| EXAMPLE 6-17 | 0.75 | 0.20 | 0.05 | 1584 | 25.2 | 0.023 |
| EXAMPLE 6-18 | 0.70 | 0.20 | 0.10 | 1674 | 23.6 | 0.022 |
| EXAMPLE 6-19 | 0.65 | 0.20 | 0.15 | 1977 | 22.1 | 0.023 |
| EXAMPLE 6-20 | 0.60 | 0.20 | 0.20 | 1908 | 20.9 | 0.021 |

TABLE 9

|  | COMPOSITION RATIO a OF RHOMBO-HEDRAL $(NaB_1)T_1O_3$ | COMPOSITION RATIO b OF TETRAGONAL $(KB_1)T_1O_3$ | COMPOSITION RATIO d OF CUBIC $SrT_1O_3$ | RELATIVE DIELECTRIC CONSTANT $\epsilon d$ | ELECTRO-MECHANICAL COUPLING FACTOR kr (%) | AMOUNT OF DISPLACEMENT (%) |
|---|---|---|---|---|---|---|
| COMPARISON 5-1 | 1.00 | 0.00 | 0.00 | 644 | 15.9 | 0.009 |
| COMPARISON 5-2 | 0.90 | 0.00 | 0.10 | 985 | 18.2 | 0.013 |
| COMPARISON 5-3 | 0.80 | 0.00 | 0.20 | 1113 | 16.3 | 0.013 |
| COMPARISON 6-1 | 0.95 | 0.05 | 0.00 | 673 | 19.8 | 0.012 |
| COMPARISON 6-2 | 0.90 | 0.10 | 0.00 | 685 | 22.6 | 0.014 |
| COMPARISON 6-3 | 0.85 | 0.15 | 0.00 | 827 | 29.0 | 0.019 |
| COMPARISON 6-4 | 0.80 | 0.20 | 0.00 | 911 | 27.2 | 0.018 |

TABLE 10

|  | COMPOSITION RATIO a OF RHOMBO-HEDRAL $(NaB_1)T_1O_3$ | COMPOSITION RATIO b OF TETRAGONAL $BaT_1O_3$ | COMPOSITION RATIO d OF CUBIC $SrT_1O_3$ | ax + by + dw | RELATIVE DIELECTRIC CONSTANT $\epsilon d$ | ELECTRO-MECHANICAL COUPLING FACTOR kr (%) | AMOUNT OF DIS-PLACE-MENT (%) |
|---|---|---|---|---|---|---|---|
| EXAMPLE 5-7 | 0.90 | 0.05 | 0.05 | 1.00 | 1668 | 34.0 | 0.032 |
| EXAMPLE 7-1 | 0.90 | 0.05 | 0.05 | 0.99 | 1773 | 35.5 | 0.034 |
| EXAMPLE 7-2 | 0.90 | 0.05 | 0.05 | 0.95 | 1808 | 36.2 | 0.035 |
| EXAMPLE 7-3 | 0.90 | 0.05 | 0.05 | 0.90 | 1694 | 33.9 | 0.033 |

What is claimed is:

1. A piezoelectric ceramic comprising:

a rhombohedral perovskite structure compound;

a tetragonal perovskite structure compound; and an orthorhombic perovskite structure compound, wherein the composition ratio of the rhombohedral perovskite structure compound, the tetragoonal perovskite structure compound and the orthorhombic perovskite structure compound and the composition ratio of an element at an A-site to an element at a B-site in each of these compounds have a relation of $0.9 \leq ax+by+cz<1.0$, and wherein a, b and c represent the composition ratio of a rhombohedral perovskite structure compound, a tetragonal perovskite structure compound and an orthorhombic perovskite structure compound in molar ratio, respectively, and x, y and z each represent the composition ratio of an element at the A-site to an element at the B-site in molar ratio in the rhombohedral perovskite structure compound, the tetragonal perovskite structure compound and the orthorhombic perovskite structure compound, respectively.

2. The piezoelectric ceramic according to claim 1, wherein the content of lead (Pb) is 1% by mass or less.

3. The piezoelectric ceramic according to claim 1, wherein the composition ratio of the rhombohedral perovskite structure compound, the tetragonal perovskite structure compound and the orthorhombic perovskite structure compound is within a range of aA+bB+cC, in molar ratio, where a represents a rhombohedral perovskite structure compound, B represents a tetragonal perovskite structure compound, and C represents an orthorhombic perovskite structure compound, and where the values of a, b and c are within a range satisfying $a+b+c=1$, $0.40<a \leq 0.99$, $0<b \leq 0.40$, $0<c<0.20$, respectively.

4. The piezoelectric ceramic according to claim 3, wherein in aA+bB+cC, the values of a, b and c are within a range satisfying $a+b+c=1$, $0.50<a \leq 0.99$, $0<b \leq 0.30$, $0<c<0.20$, respectively.

5. A piezoelectric ceramic comprising:
a rhombohedral perovskite structure compound;
a tetragonal perovskite structure compound; and
a cubic perovskite structure compound.

6. The piezoelectric ceramic according to claim 5, wherein
the composition ratio of the rhombohedral perovskite structure compound, the tetragonal perovskite structure compound and the cubic perovskite structure compound is within a range of aA+bB+dD, in molar ratio,
where A represents a rhombohedral perovskite structure compound, B represents a tetragonal perovskite structure compound, and D represents a cubic perovskite structure compound, and
where the values of a, b and d are within a range satisfying a+b+d=1, $0.60 \leq a \leq 0.99$, $0<b \leq 0.20$, $0<d \leq 0.20$, respectively.

7. The piezoelectric ceramic according to claim 5, wherein
the composition ratio of the rhombohedral perovskite structure compound, the tetragonal perovskite structure compound and the cubic perovskite structure compound and the composition ratio of an element at the A-site to an element at the B-site in each of these compounds have a relation of $0.9 \leq ax+by+dw \leq 1.0$,
where a, b, and d represent the composition ratio of a rhombohedral perovskite structure compound, a tetragonal perovskite structure compound and a cubic perovskite structure compound in molar ratio, respectively, and x, y, and w each represent the composition ratio of an element at the A-site to an element at the B-site in molar ratio in the rhombohedral perovskite structure compound, the tetragonal perovskite structure compound and the cubic perovskite structure compound, respectively.

8. The piezoelectric ceramic according to claim 5, wherein the content of lead (Pb) is 1% by mass or less.

9. A piezoelectric ceramic comprising:
a first oxide including sodium bismuth titanate;
at least one kind of second oxide selected from the group consisting of potassium bismuth titanate and barium titanate; and
at least one kind of third oxide selected from the group consisting of sodium niobate and potassium niobate.

10. The piezoelectric ceramic according to claim 9, wherein potassium bismuth titanate or barium titanate is included as the second oxide.

11. The piezoelectric ceramic according to claim 9, wherein the composition ratio of the first oxide, the second oxide and the third oxide is within a range of aA+bB+cC in molar ratio, wherein A represents a first oxide, B represents a second oxide, and C represents a third oxide, and wherein the values of a, b and c are within a range satisfying a+b+c=1, $0.40<a \leq 0.99$, $0<b \leq 0.40$, $0<c<0.20$, resvectively.

12. The piezoelectric ceramic according to claim 11, wherein
in aA+bB+cC, the values of a, b and c are within a range satisfying a+b+c=1, $0.50<a \leq 0.99$, $0<b \leq 0.30$, $0<c<0.20$, respectively.

13. The piezoelectric ceramic according to claim 9, wherein:
the first oxide includes a first element of the first oxide having at least one selected from the group consisting of sodium (Na) and bismuth (Bi), a second element of the first oxide having titanium (Ti), and oxygen (O),
the second oxide includes a first element of the second oxide having at least one selected from the group consisting of potassium (K), bismuth and barium (Ba), a second element of the second oxide having titanium, and oxygen,
the third oxide includes a first element of the third oxide having at least one selected from the group consisting of sodium and potassium, a second element of the third oxide having niobium, and oxygen, and
the composition ratio of the first oxide, the second oxide and the third oxide, the composition ratio of the first element of the first oxide to the second element of the first oxide, the composition ratio of the first element of the second oxide to the second element of the second oxide, and the composition ratio of the first element of the third oxide to the second element of the third oxide have a relation of $0.9 \leq ax+by+cz \leq 1.0$,
where a, b and c represent the composition ratio of a first oxide, a second oxide and a third oxide in molar ratio, respectively, and x represents the composition ratio of a first element of the first oxide to a second element of the first oxide in molar ratio, y represents the composition ratio of a first element of the second oxide to a second element of the second oxide in molar ratio, and z represents the composition ratio of a first element of the third oxide to a second element of the third oxide in molar ratio.

14. A piezoelectric ceramic comprising a solid solution including:
a first oxide including sodium bismuth titanate;
at least one kind of second oxide selected from the group consisting of potassium bismuth titanate and barium titanate; and
at least one kind of third oxide selected from the group consisting of sodium niobate and potassium niobate.

15. The piezoelectric ceramic according to claim 14, wherein potassium bismuth titanate or barium titanate is included as the second oxide.

16. The piezoelectric ceramic according to claim 14, wherein the composition ratio of the first oxide, the second oxide and the third oxide is within a range of aA+bB+cC in molar ratio, wherein A represents a first oxide, B represents a second oxide, and C represents a third oxide, and wherein the values of a, b and c are within a range satisfying a+b+c=1, $0.40<a \leq 0.99$, $0<b \leq 0.40$, $0<c<0.20$, respectively.

17. The piezoelectric ceramic according to claim 16, wherein in aA+bB+cC, the values of a, b and c are within a range satisfying a+b+c=1, $0.50<a \leq 0.99$, $0<b \leq 0.30$, $0<c<0.20$, respectively.

18. The piezoelectric ceramic according to claim 14, wherein:
the first oxide includes a first element of the first oxide having at least one selected from the group consisting of sodium (Na) and bismuth (Bi), a second element of the first oxide having titanium (Ti), and oxygen (O),
the second oxide includes a first element of the second oxide having at least one selected from the group consisting of potassium (K), bismuth and barium (Ba), a second element of the second oxide having titanium, and oxygen,
the third oxide includes a first element of the third oxide having at least one selected from the group consisting of sodium and potassium, a second element of the third oxide having niobium, and oxygen, and
the composition ratio of the first oxide, the second oxide and the third oxide, the composition ratio of the first element of the first oxide to the second element of the first oxide, the composition ratio of the first element of the second oxide to the second element of the second oxide, and the composition ratio of the first element of the third oxide to the second element of the third oxide have a relation of $0.9 \leq ax+by+cz \leq 1.0$, where a, b, and c represent the composition ratio of a first oxide, a second oxide and a third oxide in molar ratio, respectively, and x represents the composition ratio of a first element of the first oxide to a second element of the first oxide in molar ratio, y represents the composition ratio of a first element of the second oxide to a second element of the second oxide in molar ratio, and z represents the composition ratio of a first element of the third oxide to a second element of the third oxide in molar ratio.

19. A piezoelectric ceramic comprising:

a first oxide including sodium bismuth titanate;

at least one kind of second oxide selected from the group consisting of potassium bismuth titanate and barium titanate; and a fourth oxide including strontium titanate.

20. The piezoelectric ceramic according to claim 19, wherein the composition ratio of the first oxide, the second oxide and the fourth oxide is within a range of aA+bB+dD in molar ratio, wherein A represents a first oxide, B represents a second oxide and D represents a fourth oxide, and wherein the values of a, b and d are within a range satisfying a+b+d=1, $0.60 \leq a \leq 0.99$, $0<b \leq 0.20$, $0<d \leq 0.20$, respectively.

21. The piezoelectric ceramic according to claim 19, wherein:

the first oxide includes a first element of the first oxide having sodium (Na) and bismuth (Bi), a second element of the first oxide having titanium (Ti), and oxygen (O), the second oxide includes a first element of the second oxide having at least one selected from the group consisting of potassium (K), bismuth and barium (Ba), a second element of the second oxide having titanium, and oxygen, the fourth oxide includes a first element of the fourth oxide having strontium (Sr), a second element of the fourth oxide having titanium, and oxygen, and the composition ratio of the first oxide, the second oxide and the fourth oxide and the composition ratio of the first element of the first oxide to the second element of the first oxide, the composition ratio of the first element of the second oxide to the second element of the second oxide, and the composition ratio of the first element of the fourth oxide to the second element of the fourth oxide have a relation of $0.9 \leq ax+by+dw \leq 1.0$, where a, b and d represent the composition ratio of the first oxide, the second oxide and a fourth oxide in molar ratio, respectively, and x represents the composition ratio of the first element of the first oxide to the second element of the first oxide in molar ratio, y represents the composition ratio of the first element of the second oxide to the second element of the second oxide in molar ratio, and w represents the composition ratio of a first element of the fourth oxide to a second element of the fourth oxide in molar ratio.

22. A piezoelectric ceramic comprising a solid solution including:

a first oxide including sodium bismuth titanate;

at least one kind of second oxide selected from the group consisting of potassium bismuth titanate and barium titanate; and a fourth oxide including strontium titanate.

23. The piezoelectric ceramic according to claim 22, wherein the composition ratio of the first oxide, the second oxide and the fourth oxide is within a range of aA+bB+dD in molar ratio, wherein A represents a first oxide, B represents a second oxide, and D represents a fourth oxide, and wherein the values of a, b and d are within a range satisfying a+b+d=1, $0.60 \leq a \leq 0.99$, $0<b \leq 0.20$, $0<d \leq 0.20$, respectively.

24. The piezoelectric ceramic according to claim 22, wherein:

the first oxide includes a first element of the first oxide having sodium (Na) and bismuth (Bi), a second element of the first oxide having titanium (Ti), and oxygen (O), the second oxide includes a first element of the second oxide having at least one selected from the group consisting of potassium (K), bismuth and barium (Ba), a second element of the second oxide having titanium, and oxygen, the fourth oxide includes a first element of the fourth oxide having strontium (Sr), a second element of the fourth oxide having titanium, and oxygen, and the composition ratio of the first oxide, the second oxide and the fourth oxide and the composition ratio of the first element of the first oxide to the second element of the first oxide, the composition ratio of the first element of the second oxide to the second element of the second oxide, and the composition ratio of the first element of the fourth oxide to the second element of the fourth oxide have a relation $0.9 \leq ax+by+dw \leq 1.0$, where a, b and d represent the composition ratio of the first oxide, the second oxide and a fourth oxide in molar ratio, respectively, and x represents the composition ratio of the first element of the first oxide to the second element of the first oxide in molar ratio, y represents the composition ratio of the first element of the second oxide to the second element of the second oxide in molar ratio, and w represents the composition ratio of a first element of the fourth oxide to a second element of the fourth oxide in molar ratio.

25. A piezoelectric ceramic comprising a solid solution, the solid solution comprising:

a rhombohedral perovskite structure compound;

a tetragonal perovskite structure compound; and an orthorhombic perovskite structure compound, wherein the composition ratio of the rhombohedral perovskite structure compound, the tetragonal perovskite structure compound and the orthorhombic perovskite structure compound and the composition ratio of an element at an A-site to an element at a B-site in each of these compounds have a relation of $0.9 \leq ax+by+cz<1.0$, and wherein a, b and c represent the composition ratio of a rhombohedral perovskite structure compound, a tetragonal perovskite structure compound and an orthorhombic perovskite structure compound in molar ratio, respectively, and x, y and z each represent the composition ratio of an element at the A-site to an element at the B-site in molar ratio in the rhombohedral perovskite structure compound, the tetragonal preovskite structure compound and the orthorhombic perovskite structure compound, respectively.

26. The piezoelectric ceramic according to claim 25, wherein the content of lead (Pb) is 1% by mass or less.

27. The piezoelectric ceramic according to claim 25, wherein the composition ratio of the rhombohedral perovskite structure compound, the tetragonal perovskite structure compound and the orthorhombic perovskite structure compound is within a range of aA+bB+cC, in molar ratio, where a represents a rhombohedral perovskite structure compound, B represents a tetragonal perovskite structure compound, and C represents an orthorhombic perovskite structure compound, and where the values of a, b and c are within a range satisfying a+b+c=1, $0.40 < a \leq 0.99$, $0 < b \leq 0.40$, $0 < c \leq 0.20$, respectively.

28. The piezoelectric ceramic according to claim 25, wherein in aA+bB+cC, the values of a, b and c are within a range satisfying a+b+c=1, $0.50 < a \leq 0.99$, $0 < b \leq 0.30$, $0 < c < 0.20$, respectively.

29. A piezoelectric ceramic comprising, a solid solution comprising:

a rhombohedral perovskite structure compound;

a tetragonal perovskite structure compound; and a cubic perovskite structure compound.

30. The piezoelectric ceramic according to claim 29, wherein the content of lead (Pb) is 1% by mass or less.

31. The piezoelectric ceramic according to claim 29, wherein the composition ratio of the rhombohedral perovskite structure compound, the tetragonal perovskite structure compound and the cubic perovskite structure compound is within a range of aA+bB+dD in molar ratio, where A represents a rhombohedral perovskite structure compound, B represents a tetragonal perovskite structure compound, and D represents a cubic perovskite structure compound, and where the values of a, b and d are within a range satisfying a+b+d=1, $0.60 \leq a \leq 0.99$, $0 < b \leq 0.20$, $0 < d \leq 0.20$, respectively.

32. The piezoelectric ceramic according to claim 29, wherein the composition ratio of the rhombohedral perovskite structure compound, the tetragonal perovskite structure compound an the cubic perovskite structure compound and the composition ratio of an element at the A-site to an element at the B-site in each of these compounds have a relation of $0.9 \leq ax+by+dw \leq 1.0$, where a, b and d represent the composition ratio of a rhombohedral perovskite structure compound, a tetragonal perovskite structure compound and a cubic perovskite structure compound in molar ratio, respectively, and x, y and w each represent the composition ratio of an element at the A-site to an element at the B-site in molar ratio in the rhombohedral perovskite structure compound, the tetragonal perovskite structure compound and the cubic perovskite structure compound, respectively.

* * * * *